Figure 1:
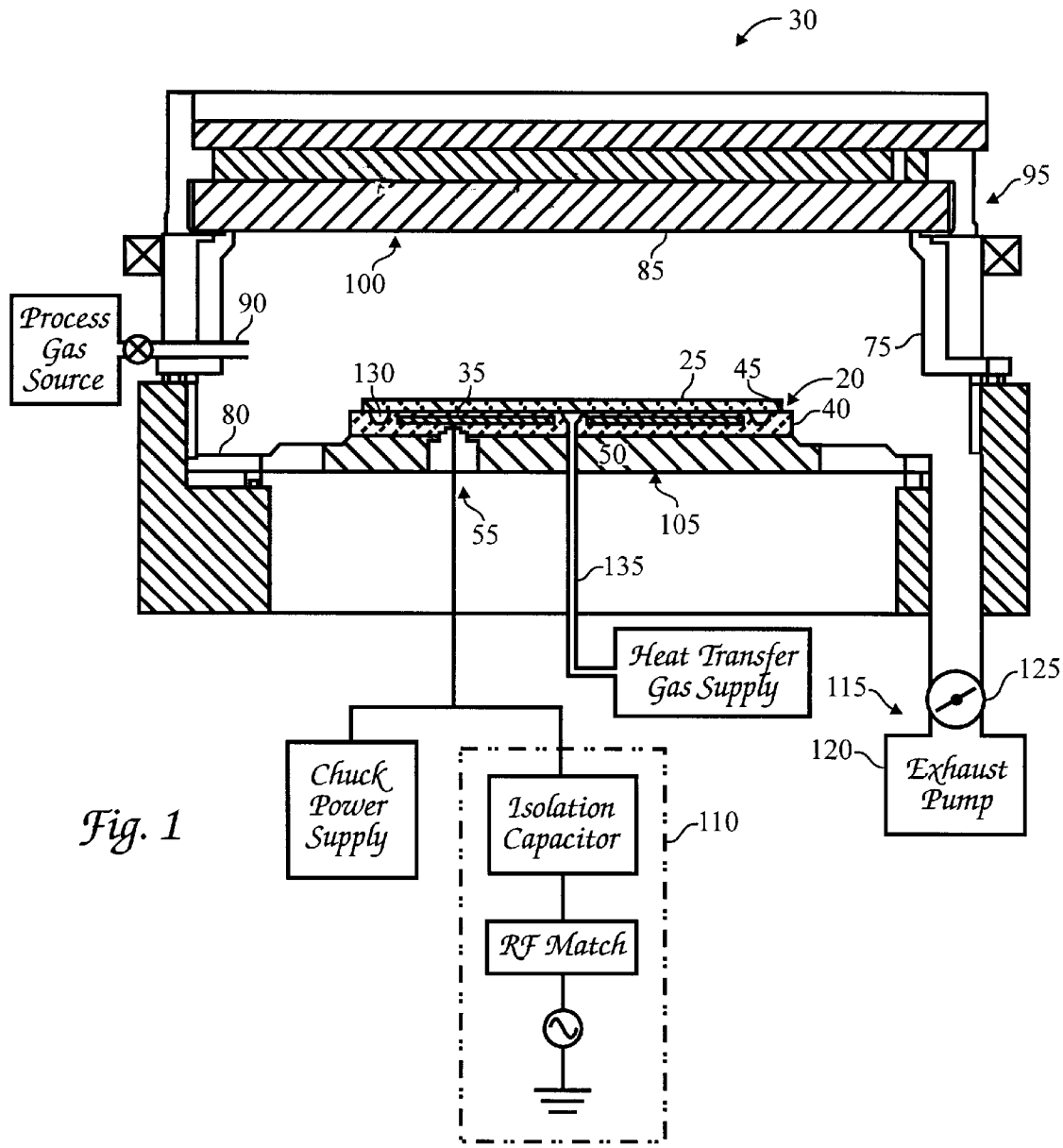

United States Patent [19]
Herchen

[11] Patent Number: 6,072,685
[45] Date of Patent: Jun. 6, 2000

[54] ELECTROSTATIC CHUCK HAVING AN ELECTRICAL CONNECTOR WITH HOUSING

[75] Inventor: Harald Herchen, San Jose, Calif.

[73] Assignee: Applied Materials, Inc., Santa Clara, Calif.

[21] Appl. No.: 09/083,638

[22] Filed: May 22, 1998

[51] Int. Cl.[7] .................................................. H02N 13/00
[52] U.S. Cl. ........................................ 361/234; 279/128
[58] Field of Search .................................. 361/230–235; 279/128

[56] References Cited

U.S. PATENT DOCUMENTS

| | | | |
|---|---|---|---|
| 5,250,137 | 10/1993 | Arami et al. | 156/345 |
| 5,255,153 | 10/1993 | Nozawa et al. | 361/234 |
| 5,348,497 | 9/1994 | Nitescu | 439/824 |
| 5,478,429 | 12/1995 | Komino et al. | 156/345 |
| 5,618,350 | 4/1997 | Ishikawa et al. | 118/725 |
| 5,625,526 | 4/1997 | Watanabe et al. | 361/234 |
| 5,691,876 | 11/1997 | Chen et al. | 361/234 |
| 5,801,915 | 9/1998 | Kholodenko et al. | 361/234 |

FOREIGN PATENT DOCUMENTS 0668608  2/1995  European Pat. Off. .
0 725 426 A2  8/1996  European Pat. Off. ........ H01L 21/00

OTHER PUBLICATIONS

PCT International Search Report Dated Aug. 11, 1999.

*Primary Examiner*—Fritz Fleming
*Attorney, Agent, or Firm*—Janah and Associates

[57] ABSTRACT

An electrostatic chuck 20 useful for holding a substrate 25 in a process chamber 30 that is chargeable by a voltage provided by a voltage supply terminal 60 in the process chamber. The electrostatic chuck 20 comprises a dielectric member 40 covering an electrode 35, optionally, a base 50 below the dielectric member, and at least one electrical connector 55 capable of providing an electrical connection between the electrode 35 and the voltage supply terminal 60 in the process chamber 30. The electrical connector 55 comprises an electrical conductor 65, which passes through the base 50 and electrically connects the electrode 35 to a voltage supply terminal 60 in the chamber 30 and a housing 70 surrounding the electrical conductor 65. In one version, the housing 70 is expandable to provide a substantially gas sealed environment around the electrical conductor 65. Preferably, the housing 70 comprises channels 255 having dimensions sized sufficiently small to reduce arcing and plasma discharge of gas in the housing 70 during use of the chuck 20 in the process chamber 30.

36 Claims, 2 Drawing Sheets

ELECTROSTATIC CHUCK HAVING AN ELECTRICAL CONNECTOR WITH HOUSING

BACKGROUND

The present invention relates to an electrostatic chuck for holding a substrate during processing of the substrate in a process chamber.

Electrostatic chucks are used to hold substrates in various applications, including for example, holding a silicon wafer in a process chamber during semiconductor fabrication. A typical electrostatic chuck comprises an electrode covered by dielectric material, for example, a ceramic such as aluminum oxide or aluminum nitride. When the electrode is electrically biased with respect to the substrate, an attractive electrostatic force is generated that holds the substrate to the chuck. In monopolar electrode chucks, an electrically charged plasma above the substrate provides electrostatic charge to the substrate, and in bipolar electrode chucks, bipolar electrodes are electrically biased relative to one another to provide the electrostatic attractive force.

The electrostatic chuck is attached to a support or pedestal in the process chamber through which an electrical connector extends to connect the electrode of the chuck to a voltage terminal in the process chamber. Typically, the support is made of metal to serve as a process electrode of a plasma generator that capacitively couples RF energy to process gas in the chamber to form a plasma. In conventional chucks, an insulating plug is provided around the electrical connector to electrically insulate the connector from the metal support. However, during plasma processing the electrostatic chuck and support are heated, and the differing coefficients of thermal expansion between the electrostatic chuck and the support often causes a failure in electrical connection or cause the electrical connector to crack or break. This is particularly a problem for electrostatic chucks having dielectric members made from a material having a high thermal expansion coefficient, such as aluminum oxide, or made from a material having a thermal expansion coefficient that widely differs from the expansion coefficient of the support. Thus it is desirable to have an electrical connector that allows relative movement between the electrostatic chuck and the support without interrupting or shorting the electrical connection.

Another problem with the electrical connector in conventional electrostatic chucks occurs because the interface between the chuck and the support does not form a gas tight seal. Process gas permeates into the space between the chuck and the support and reaches and surrounds the electrical connector during operation of the chuck. The chemically reactive process gas erodes the electrical connector or its surrounding insulator. For example, $CF_4$ gas rapidly erodes ceramic oxides, and $O_2$ gas rapidly erodes polymer materials. In addition, the high voltage applied to the electrode of the chuck that passes through the electrical connector couples to the gas surrounding the electrical connector and causes arcing and plasma glow discharge in the process gas. The arcing and plasma glow discharges provide electrically conducting pathways that disrupt the process plasma by leaking energy from the plasma or damaging surrounding electrical connector components. It is desirable to have an electrical connector that reduces, or entirely eliminates plasma glow discharge and arcing of the gas around the electrical connector.

A further problem arises when gas, such as air or nitrogen, that is trapped in spaces within the electrical connector, slowly leaks out when the process chamber is pumped down during a low pressure vacuum operation. The resultant "virtual leak" of slowly escaping gas substantially increases the time taken to pump out the process chamber. Moreover, even when the process is performed at relatively low vacuum (high pressure), for example above 40 mTorr, the trapped gas should be removed before processing a substrate, because the leaking gas changes the composition of the process gas and disrupts processing uniformity across the substrate surface, especially when the trapped gas contains water vapor.

Thus there is a need for an electrostatic chuck that has an electrical connector with an enclosed substantially gas sealed environment. There is a further need for an electrostatic chuck that reduces plasma glow discharge or arcing of the gas around the electrical connector of the chuck. It is further desirable for the chuck to have an electrical connector that allows thermal expansion of surrounding structures without damaging or breaking the electrical connection to the electrode of the chuck. There is a further need for an electrostatic chuck having an electrical connector which will not rapidly degrade in erosive process gas environments.

SUMMARY

The present invention is directed to electrostatic chuck that holds a substrate in a process chamber and is capable of providing an enclosed substantially gas sealed environment, reduced plasma glow discharge or arcing of gas around the electrical connector, and low thermal expansion of surrounding structures. The electrostatic chuck is chargeable by a voltage provided by a voltage supply terminal in the process chamber. The electrostatic chuck comprises a dielectric member covering an electrode, an electrical connector capable of providing an electrical connection between the electrode and the voltage supply terminal in the process chamber. The electrical connector comprises an electrical conductor that electrically engages the electrode. An expandable housing surrounding the electrical conductor comprises an expandable structure having slidable contacting surfaces pressed against one another, and more preferably, the expandable housing comprises a jacket having a sealing surface that engages another surface to form a substantially gas sealed environment.

In another aspect, the electrostatic chuck comprises a dielectric member covering an electrode, and an electrical connector capable of providing an electrical connection between the electrode and the voltage supply terminal in the process chamber. The electrical connector comprises an electrical conductor that electrically engages the electrode. The housing comprises a channel having a dimension sized sufficiently small to reduce arcing and plasma discharge of gas in the channel during use of the chuck in the process chamber. For example, the housing can comprise one or more jackets that cooperate to define the channel, and more preferably, the housing comprises jackets having cylindrical shapes that are concentric to one another.

In yet another aspect, the electrostatic chuck comprises a dielectric member covering an electrode, means for electrical connecting the electrode to the voltage supply terminal in the process chamber, and means for maintaining a substantially gas sealed environment around the electrical connecting means.

One method of electrostatically holding a substrate during processing of the substrate in a process zone, comprises the steps of placing the substrate on the electrostatic chuck in the process zone, and providing a voltage to an electrode of the electrostatic chuck via an electrically conducting pathway to charge the electrode to electrostatically hold the substrate on the electrostatic chuck. A substantially gas sealed environment is maintained around the electrically conducting pathway during processing of a substrate in the process chamber to reduce arcing or plasma discharge of gas around the electrically conducting pathway.

DRAWINGS

Figure 2:
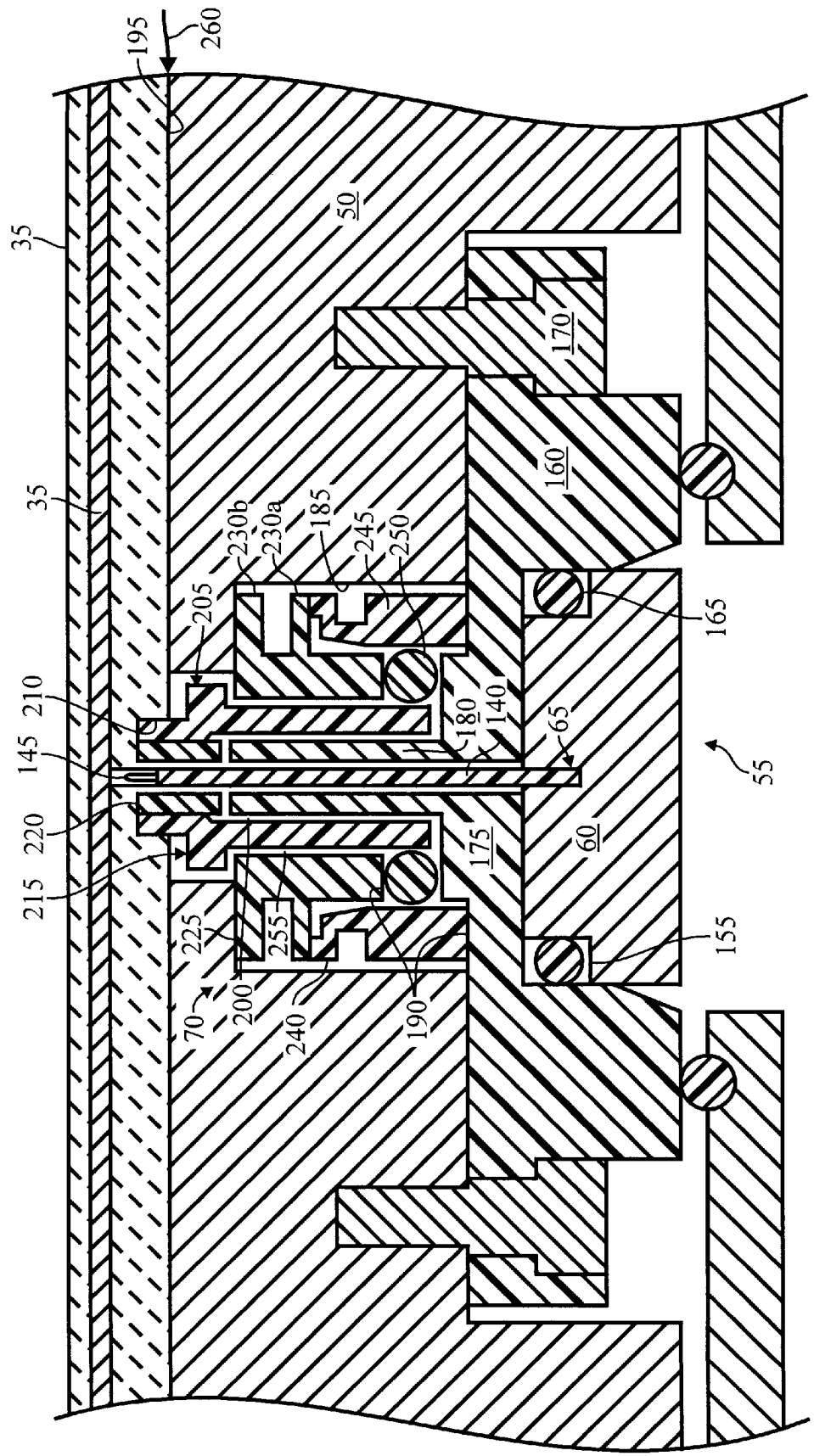

These features, aspects, and advantages of the present invention will become better understood with regard to the following description, appended claims, and accompanying drawings which illustrate examples of the invention, where:

FIG. 1 is a schematic sectional side view of a process chamber comprising an electrostatic chuck of the present invention; and FIG. 2 is a schematic sectional side view of an electrical connector of the present invention.

DESCRIPTION

The principles of the present invention are illustrated in the context of an electrostatic chuck 20 useful for holding a substrate 25 in a process chamber 30 for processing the substrate. However, many other versions of the invention should be apparent to those skilled in the art, without deviating from the scope of the invention, and the spirit and scope of the present invention should not be limited to the description of the preferred versions contained herein. As illustrated in FIG. 1, an electrostatic chuck 20 according to the present invention comprises one or more electrodes 35 covered by a dielectric member 40 and having a receiving surface 45 for receiving a substrate thereon. Optionally, a base 50 supports the dielectric member, or the electrode 35 and the base 50 form the same structure. As illustrated in FIG. 2, an electrical connector 55 electrically connects the electrode 35 to a voltage supply terminal 60 in the process chamber, that provides a voltage to charge the electrode 35 to generate electrostatic forces for holding the substrate 25. The electrical connector 55 comprises an electrical conductor 65 electrically connected to the electrode 35, and a housing 70 that surrounds the electrical conductor 65.

Alternatively, the electrostatic chuck 20 can comprise a bipolar electrostatic chuck (not shown) that comprises at least two substantially coplanar electrodes 35, that generate substantially equivalent electrostatic clamping forces. A differential electrical voltage is applied to each of the bipolar electrodes by electrical connectors 55 according to the present invention to maintain the electrodes at differential electric potential to induce electrostatic charge in the substrate 25 and electrodes 35. The bipolar electrodes can comprise two opposing semicircular electrodes 35 with an electrical isolation void therebetween that is covered by the dielectric member 40 as described in U.S. patent application Ser. No. 08/965,690 filed on Nov. 6, 1997 entitled, "ELECTROSTATIC CHUCK HAVING IMPROVED GAS CONDUITS," by Weldon et al. which is incorporated herein by reference. Other bipolar electrode configurations include inner and outer rings of electrodes 35, polyhedra patterned electrodes, or other segmented electrode forms embedded in the dielectric member 40.

The electrostatic chuck 20 is secured in a process chamber 30 suitable for processing semiconductor substrates 25. Generally, the process chamber 30 comprises an enclosure having sidewalls 75, a bottom wall 80, and a ceiling 85, fabricated from a variety of materials including metals, ceramics, and polymers. Process gas is introduced into the process chamber 30 through a process gas distributor 90, and a plasma is formed from process gas by a plasma generator 95. The plasma generator 95 typically comprises a pair of process electrodes 100, 105 to capacitively couple and energize the process gas to form a plasma. Typically, a portion of the chamber wall, such as the ceiling 85, and the base 50 (or the electrode 35) are electrically biased relative to one another by an RF voltage supply 110, to serve as the process electrodes 100, 105. In addition, the plasma generator 95 can comprise an inductor coil (not shown) adjacent to the process chamber 30 to generate an inductive field that inductively couples RF power to the process gas to form a plasma. An exhaust system 115 comprising an exhaust pump 120 with a throttle valve 125 is used to exhaust spent process gas and to control the pressure of the process gas in the process chamber 30.

In operation, a substrate 25 is placed on the dielectric member 40 of the electrostatic chuck 20, and the process chamber 30 is evacuated to a low pressure. Thereafter, process gas is introduced into the chamber 30 via the gas distributor 90, and plasma is formed from the process gas by the plasma generator 95. A DC voltage applied to the electrode 35 causes electrostatic charge to accumulate in the electrode 35 for Coulombic chucks, or at the interface of the dielectric member 40 and the substrate 25 for Johnsen-Raebek chucks. The electrostatic charge in the electrode 35 attracts charged species from the plasma which accumulate in the substrate 25 covering the electrostatic chuck 20. The accumulated opposing electrostatic charge in the substrate 25 and the electrostatic chuck 20 results in an attractive electrostatic force that electrostatically holds the substrate to the dielectric member 40 of the electrostatic chuck 20.

FIG. 1 illustrates an electrostatic chuck 20 according to the present invention that includes a dielectric member 40 that is at least partially surrounding and electrically isolating the electrode 35 from the substrate 25. The dielectric member 40 has a shape and size corresponding to that of the substrate 25 to support the substrate and maximize the heat transfer interface between the substrate and the dielectric member 40. Typically, when the substrate 25 is disk shaped, the dielectric member 40 comprises a right cylinder having a diameter of about 200 mm to 350 mm (8 to 14 inches).

The dielectric member 40 is made from a material that is resistant to erosion by the process gas and/or plasma, and can withstand the operating temperatures of the process environment and continue to provide the necessary dielectric or semiconducting properties. Suitable materials include, for example, ceramic materials, such as $Al_2O_3$, AlN, BN, Si, SiC, $Si_3N_4$, $TiO_2$, $ZrO_2$, or mixtures and compounds thereof; or polymer materials such as polyimide or polyaramid. In a preferred embodiment, the dielectric member 40 comprises a unitary structure or material, such as monocrystalline sapphire, which is single crystal alumina that exhibits high chemical and erosion resistance in halogen plasma environments, especially halogen-containing environments. Monocrystalline sapphire also has a high melting temperature that allows use of the electrostatic chuck 20 at temperatures exceeding 1000° C. or even exceeding 2000° C. Preferably, the sapphire material is also a high purity material containing a low level of contaminants that reduces contamination of the substrate 25 being processed in the chamber 30. Typically, the dielectric member 40 comprises a ceramic such as aluminum oxide or aluminum nitride having a thermal expansion of at least about $9 \times 10^{-6}$/°C., and typically from about 6 to about $10 \times 10^{-6}$/°C.

Preferably, the dielectric member 40 comprise grooves 130 that are sized and distributed to hold heat transfer gas such that substantially the entire surface of the substrate 25 is uniformly heated or cooled. A suitable pattern includes, for example, a pattern of intersecting grooves 130 that cut through the thickness of the dielectric member 40. Typically, the heat transfer gas contained in the grooves 130 comprises helium or argon which is supplied at a pressure of about 5 to about 30 Torr. The heat transfer gas is supplied to the grooves 130 through gas supply channels 135, preferably, at least one of which terminates at the intersection of one or more of the grooves 130. The gas supply channels 135 and grooves 130 are formed by conventional techniques, such as drilling, boring, or milling, through the dielectric material 40.

The electrode 35 covered by the dielectric member 40, comprises an embedded metal structure, or a pattern of dopant material in the dielectric member 40, that has a sufficient area to generate electrostatic attraction forces uniformly across the substrate. Suitable metal electrodes 35 can be made from copper, nickel, chromium, aluminum, molybdenum, and combinations thereof. For a substrate 25 having a diameter of 200 to 300 mm (6 to 8 inches), the electrode 35 typically covers a total area of about 7,000 to about 70,000 sq. mm. In a preferred version, the electrode 35 comprises a wire mesh of metal, and is preferably, refractory metal having a melting point of at least about 2200° C. The thickness of the electrode 35 is preferably from about 1 $\mu$m to about 100 $\mu$m, and more typically from 1 $\mu$m to 50 $\mu$m.

Typically, the optional base 50 has a shape and size corresponding to that of the dielectric member 40 to provide a wide surface area for supporting the dielectric member 40, and to maximize the heat transfer interface between the base 50 and the dielectric member 40. Preferably, the base 50 is a right cylinder having a diameter of about 200 mm to 350 mm (8 to 14 inches), and a thickness of about 1.5 to 2 cm. The base 50 can be electrically connected to the RF voltage supply 110 to serve as one of the process electrodes 100, 105 to capacitively couple energy to the process gas to form a plasma from the process gas. Alternatively, the base 50 can be electrically grounded or can electrically "float" while the electrode 35 embedded in the dielectric member 40 is used to capacitively couple RF energy to the process gas. When serving as a process electrode, the base 50 is made from a metal, such as aluminum, and has an anodized aluminum oxide coating that is resistant to erosion by the process gas.

The electrical connector 55 serves as a means for electrical connecting the electrode 35 to the voltage supply terminal 60 in the process chamber 30. The electrical connector 55 comprises an electrical conductor 65 that electrically energizes the electrode 35, and is connected to the voltage supply terminal 60. In a preferred structure, the electrical conductor 65 comprises an electrical lead 140, such as a wire or a rod, having a sufficient length to extend from the terminal 60, through the dielectric member 40 and the optional base 50, and terminating in a contact head 145 that electrically engages the electrode 35. Typically, the length of the electrical lead 140 is from about 10 mm to about 50 mm, and the width of the electrical lead 140 is from about 0.2 mm to about 10 mm. Other equivalent structures for the electrical connector 55 comprise any conducting shape suitable for extending through or around the dielectric member 40, including rectangular leads, contact posts, and laminated conducting structures.

Preferably, the contact head 145 is a right cylinder with a central axis perpendicular to the electrode 35, and having a height of about 15 mm and a diameter of about 1 mm. More preferably, the contact head 145 comprises a rounded surface in electrical contact with the exposed portion of the electrode 35 to enable the contact head 145 to move freely across the electrode to compensate for horizontal movement of the dielectric member 40 relative to the base 50 while still maintaining an electrical connection to the electrode 35. Most preferably, the contact head 145 is bonded or is pressed against the electrode 35 to allow sufficient range of motion that also compensates for the vertical expansion of the dielectric member 40 relative to other surrounding structures, such as the base 50. In one embodiment, shown in FIG. 2, the electrical lead 140 comprises a cylindrical tube with the contact head 145 positioned therein, the tube having an outer diameter of about 4 mm and an inner diameter of about 1.5 mm. The rounded surface of the contact head 145 is biased against and makes electrical contact with the electrode 35 while a lower portion of the contact head 145 remains in the tube. Alternatively, the electrical conductor 65 may comprise a solid cylinder (not shown) having a flat or conical contact surface at one end, that is connected to the voltage supply terminal 60 at the other end, by a long electrical lead 140 therebetween. The electrical conductor can also comprise a lead 140 connected to a flat plate (not shown) that connects to the electrode 35.

The voltage supply terminal 60 is made of conducting metal having an interface that forms a tight seal with an insulator plate 160 which electrically isolates the voltage terminal from the base 50 and/or the bottom wall 80 of the chamber 30. In one embodiment, as shown in FIG. 2, the voltage supply terminal 60 comprises a cylinder of copper that is press fitted into a recessed portion of the insulator plate 160. The voltage supply terminal 60 has a groove or shoulder 155 cut into a peripheral edge of an upper surface of the terminal, for receiving an O-ring 165 therein to form a tight seal with the insulator plate 160. Preferably, the insulator plate 160 comprises an electrically insulating material for receiving the voltage supply terminal 60, that is nonporous, resistant to erosion by the process gas, and able to withstand operating temperatures. Preferably, the insulator plate 160 is made from a material that withstands the aggressive halogen-containing process gases at sustained elevated temperatures of up to about 250° C. More preferably, the insulator plate 160 is composed of a ductile or malleable material which can be firmly attached to the base 50, and be stretched or compressed to allow for the thermal expansion of the base 50. Suitable materials include, for example, a polyimide sheet or a Teflon sheet. The insulator plate 160 is attached to the base 50 by any suitable means including bolt fasteners 170 as shown in FIG. 2. In another aspect, also shown in FIG. 2, the insulator plate 160 further comprises a raised portion 175 in the center of its top surface to serve as guide in assembling the electrostatic chuck 20, and a shield portion 180 adjacent to the electrical conductor 65. The shield portion 180 comprises a hollow cylinder having a length that extends substantially the entire thickness of the base 50. Besides serving as a guide for assembly and a shield for the electrical conductor 65, the raised portion 175 and shield portion 180 of the insulator plate 160 also decrease the amount of air or gas which can become trapped in the expandable housing 70 by reducing the volume of empty space.

The housing 70 around the electrical connector 55 isolates the electrical conductor 65 from the surrounding structures. In one preferred embodiment, the housing 70 is a movable or expandable housing surrounding the electrical conductor 65 that expands in relation to the surrounding structures to confine and isolate the electrical conductor through a range of operating temperatures. By isolate it is meant any one of gas flow isolation, electrical isolation, or mechanical isolation. Preferably, the electrical connector 55 passes through a bore 185 in the base 50 supporting the dielectric member 40, and the expandable housing 70 is adapted to expand by a sufficient amount to compensate for the thermal expansion of the base 50 during use of the chuck 20 in the process chamber 30. The expandable housing 70 comprises one or more overlapping members that are capable of moving relative to the electrical conductor 65, and have slidable contact or sealing surfaces 190 pressed against one another to form a movable gas tight seal that compensates for the thermal expansion of surrounding members such as the base 50 and/or dielectric member 40. The components of the housing 70 can also be made of any suitable insulating or conducting material that is resistant to erosion by the process gas or resistant to damage from thermal stresses. Preferably, the components are made of a material such as Teflon or polyimide, which has intrinsic self lubricating properties to aid in the movement of the housing 70.

Preferably, the expandable housing 70 comprises one or more jackets, O-rings, and sealing surfaces 190 which engage other surfaces, such as the base 50 or insulator member 160, to form a substantially gas sealed environment around the electrical conductor 65. By gas sealed it is meant a structure that limits or reduces gas flow through the electrical connector 55. However, because the housing 70 is expandable it does not form a completely gas tight seal, and some gas leaks into the electrical connector 55 through an interface 195 between the dielectric member 40 and the base 50 during operation of the process chamber 30, or when the chamber is vented. Thus, the components of the housing 70 must define at least one continuous gas flowpath 200 through which gas which becomes trapped in the expandable housing can be removed. Preferably, the width dimension of the gas flowpath 200 formed between the components of the housing 70 is less than about 0.5 mm, and more preferably less than about 0.25 mm. At these sizes, given the typical operating pressures in the process chamber 30 and voltages applied to the electrical conductor 65, the mean free path available to charged particles under the influence of the electric field generated by the electrical conductor is too low to allow ionization of gas in the channels or other gaps and spaces defined by the housing 70, thereby preventing formation of a plasma in these regions.

For example, in a preferred embodiment shown in FIG. 2, the housing 70 comprises a plurality of cylindrical jackets surrounding the electrical conductor 65, each jacket having a sealing surface 190 that is pressed against another sealing surface of a wall or another jacket. More preferably, as shown in FIG. 2, the expandable housing 70 comprises cylindrical jackets which are concentric to one another, and surrounding the electrical conductor 65. A first jacket 205 has an inner diameter sufficiently large to accommodate the electrical conductor 65, and comprises an outer diameter sufficiently small to fit in a bore 210 of the dielectric layer 40. For example, the first jacket 205 can comprise a tube having an outer diameter of from about 4 mm to about 6 mm, and an inner diameter from about 2 mm to about 4 mm. Preferably, the first jacket 205 further comprises a ring 215 having an outer diameter larger than the bore 210 positioned near the end of the first jacket inserted into the bore, to prevent over insertion of the first jacket which could damage the electrode 35 and dielectric member 40. More preferably, the ring 215 has an outer diameter of from about 5 mm to about 8 mm, and is positioned from about 3 mm to about 7 mm down from the top of the first jacket 205. As shown in FIG. 2, a sleeve 220 or collar made of the same material as the first jacket 205 can be used between an inner surface of the jacket 205 and the electrical conductor 65 in the bore 210 to further reduce the size of the gap defined by the electrical conductor and the first jacket 205. Also, the outer diameter of the first jacket 205 which extends below the ring 215 need not be sufficiently small to fit in the bore 210 of the dielectric member 40, it is only necessary that it be sufficiently small to accommodate a second jacket 225.

The second jacket 225 comprises two outer rings or ledges 230. The second jacket 225 comprises an inner diameter smaller than the outer diameter of the ring 215 of the first jacket 190 to hold the first jacket 190 in place during assembly of the chuck 20, to prevent first jacket from completely withdrawing from the bore 210 in the dielectric member 40 during operation. The outer diameter of the ledges 230 of the second jacket 225 is sufficiently smaller than the bore 185 in the base 50 in which it is placed to allow some lateral movement to compensate for thermal expansion of the base or dielectric member 40. This lateral movement is made possible by a smooth planar surface on the upper most of the two outer ledges 230 on the top of the second jacket 225, which is in slidable contact with a smooth metal surface of the bore 185 in the base 50. Because the second jacket 225 is made of an elastic material, the lower outer ledge 230a changes in shape or deforms when pressed against a raised lip 240 of a third jacket 245. The elastic material used to fabricate the lower outer ledge 230a when deformed exerts an upward force on the second jacket 225 to maintain its upper surface in slidable contact with the smooth metal surface of the base 50, thereby preventing the second jacket 225 from tipping, becoming jammed in the bore 185, and impeding movement of the housing 70.

The third jacket 245, is concentric to and surrounds the second jacket 225. As with the second jacket 225, the third jacket 245 is made of an elastic material that changes shape when a force is applied to the raised lip 240 on the top of the third jacket. At least a portion of the raised lip 240 capable of resiliently pressing against the lower outer ledge 230a of the second jacket as shown in FIG. 2. The third jacket 245 also has an outer diameter sufficiently smaller than the diameter of the bore 185 in the base 50 to allow lateral movement of the third jacket within the bore of the base. The third jacket 245 further comprises a smooth planar surface abutting the insulator plate 160 to permit a sliding movement between the two. In addition, the inner diameter of the third jacket 245 should be larger than the diameter of the raised portion 175 of the insulator plate 160 to allow lateral movement of the third jacket relative to the insulator plate. The bottom surface of the third jacket 245 slides over the top surface of the insulator plate 160 until the inner surface of the third jacket abuts the outer diameter of the raised portion 175 of the insulator plate 160.

An O-ring 250 is bounded by an inner radial surface of the third jacket 245, the outer surface of the first jacket 205, and a lower surface of the second jacket 225. The O-ring 250 closes off annular passageways or channels 255 formed by the jackets, making sufficiently small to substantially preclude plasma formation in the channels. The O-ring 250 is sized to fill a void defined by the members of the expandable housing 70 the amount of air or gas which can become trapped in the housing is thereby reduced, further reducing the possibility of plasma formation in the housing. The O-ring 250 is also dimensioned to hold the members of the expandable housing 70 in position relative to one another during assembly of the electrical connector 55. Preferably, the O-ring 250 is composed of a material that is resistant to halogen-containing gases and to temperatures in the range of operating temperatures of the electrostatic chuck 20. More preferably, the O-ring 250 is composed a resilient material that will not impede movement of the expandable housing 70. Suitable material includes, for example, polyethylene, polyurethane, polycarbonate, polystyrene, nylon, polypropylene, polyvinylchloride, polyethylene terephthalate, fluoroethylene propylene copolymers, and silicone.

The electrostatic chuck 20 is useful for holding substrates 25 in high density plasma environments, for example, where the RF energy coupled to the chamber 30 is on the order of 5 to 25 watts per $cm^2$. High density plasmas typically contain a higher ion density of charged plasma species in thin plasma sheaths and/or plasma ions having ion energies in excess of 1,000 eV. Referring to FIG. 2, in high density plasma environments, plasma formed above the electrostatic chuck 20 penetrates into the interface 195 between the dielectric member 40 and the base 50, as shown by arrow 260, and reaches the gas flowpaths 200 defined by the expandable housing 70 of the electrical connector 55.

The dimensions of the jackets, O-rings, and sealing surfaces of the expandable housing 70, cooperate to define channels 255 and spaces shaped and sized to reduce or altogether prevent formation of arcing or plasma glow discharges of the gas that is contained within or leaks into these spaces. For example, the inner diameter of the second jacket 225 is sized only sufficiently larger that the outer diameter of the first jacket 205 so that the gap or spaces therebetween are sufficiently small to control the kinetic energy of charged plasma species in the spaces by providing a small mean free path that limits acceleration, and resultant avalanche breakdown of the charged species that is necessary to ignite a plasma. Avalanche breakdown occurs when charged particles are accelerated by the electric field along a path that is sufficiently large to allow them to collide with the atoms of other gas molecules causing further ionization. These charged particles cause ionization and so on until a plasma is formed in the electrical connector 55. The small mean free path in the channels 255 also results in fewer energy transferring collisions between charged gas species which further reduces plasma formation. In this manner, the gap between the jackets 205, 225, 245 are sized sufficiently small to prevent formation of a plasma in the regions adjacent to, and defined by, the jackets of the expandable housing 70.

An electrostatic chuck 20 comprising an electrical connector 55 according to the present invention, reduces the potential for damage to the electrical conductor 65, substantially increasing the process uniformity and process throughput. The movable housing 70 of the electrical connector 55 comprises components made of a polyimide material, which surround and electrically isolate the electrical conductor 65. These components of the movable housing 70 form sliding joints that permit the housing 70 to expand and move to compensate for relative motion between the electrical conductor 65, the dielectric member 40, and/or the base 50. Gas flowpaths 200 defined by the components of the expandable housing 70 enable removal of erosive process gases that can leak into the electrical connector 55 during processing. These gas flowpaths 200 defined by the components of the expandable housing 70, are sized and shaped sufficiently small to substantially preclude plasma formation in the electrical connector 55.

While the present invention has been described in considerable detail with reference to certain preferred versions, many other versions should be apparent to those of ordinary skill in the art. For example, the electrostatic chuck 20 can be used for holding other substrates 25 or for other applications, for example, holding a sheet of paper on a flat bed plotter. Therefore, the spirit and scope of the appended claims should not be limited to the description of the preferred versions contained herein.

What is claimed is:

1. An electrostatic chuck for holding a substrate in a process chamber, the electrostatic chuck being chargeable by a voltage provided by a voltage supply terminal in the process chamber, the electrostatic chuck comprising:

(a) a dielectric covering an electrode; and (b) an electrical connector capable of providing an electrical connection between the electrode and the voltage supply terminal in the process chamber, the electrical connector comprising an electrical conductor that electrically engages the electrode, and an expandable housing surrounding the electrical conductor, the expandable housing comprising surfaces capable of moving laterally relative to one another.

2. The electrostatic chuck of claim 1 wherein the electrical conductor passes through a base supporting the dielectric member, and wherein the surfaces are capable of moving a sufficient amount to allow for the thermal expansion of the base during use of the electrostatic chuck in a process chamber.

3. The electrostatic chuck of claim 1 wherein the surfaces slidably contact one another.

4. The electrostatic chuck of claim 1 wherein the surfaces engage one another to form a substantially gas sealed environment.

5. The electrostatic chuck of claim 1 wherein the surfaces are on first and second jackets.

6. The electrostatic chuck of claim 1 wherein the surfaces are on a plurality of jackets that cooperate to define a channel therebetween.

7. The electrostatic chuck of claim 1 wherein the surfaces are on a plurality of concentric cylinders.

8. The electrostatic chuck of claim 1 wherein the dielectric comprises at least one of the following characteristics:

(i) the dielectric comprises a ceramic having a thermal expansion coefficient of at least about $4 \times 10^{-6}/°C.$;

(ii) the dielectric comprises a monocrystalline material; or (iii) the dielectric comprises sapphire.

9. An electrostatic chuck for holding a substrate in a process chamber, the electrostatic chuck being chargeable by a voltage provided by a voltage supply terminal in the process chamber, the electrostatic chuck comprising:

(a) a dielectric covering an electrode;

(b) an electrical connector capable of connecting the electrode to the voltage supply terminal in the process chamber; and (c) an expandable housing surrounding the electrical connector and comprising contacting surfaces capable of sliding relative to one another to maintain a substantially gas sealed environment around the electrical connector.

10. The electrostatic chuck of claim 9 wherein the surfaces are capable of moving laterally relative to one another.

11. The electrostatic chuck of claim 9 wherein the surfaces are capable of sliding a sufficient amount to allow for thermal expansion of the electrostatic chuck.

12. The electrostatic chuck of claim 9 wherein the surfaces are pressed against one another.

13. The electrostatic chuck of claim 9 wherein the surfaces are on a plurality of jackets.

14. The electrostatic chuck of claim 13 wherein the jackets cooperate to define a channel therebetween.

15. An electrostatic chuck for holding a substrate in a process chamber, the electrostatic chuck being chargeable by a voltage provided by a voltage supply terminal in the process chamber, the electrostatic chuck comprising:

(a) a dielectric covering an electrode; and (b) an electrical connector capable of providing an electrical connection between the electrode and the voltage supply terminal in the process chamber, the electrical connector comprising an electrical conductor that electrically engages the electrode, and a housing surrounding the electrical conductor, the housing comprising multiple parts capable of moving relative to one another by a sufficient amount to compensate for a thermal expansion of the electrostatic chuck.

16. The electrostatic chuck of claim 15 wherein the housing comprises one or more jackets that cooperate to define a channel.

17. The electrostatic chuck of claim 16 wherein the jackets are concentric to one another.

18. The electrostatic chuck of claim 16 wherein the channel comprises a width of less than about 1 mm.

19. The electrostatic chuck of claim 16 wherein the channel comprises a length of at least about 0.1 mm.

20. The electrostatic chuck of claim 16 wherein the channel comprises a convoluted pathway.

21. The electrostatic chuck of claim 16 wherein the housing is expandable to maintain a substantially gas sealed environment around the electrical conductor.

22. An electrostatic chuck for holding a substrate in a process chamber, the electrostatic chuck being chargeable by a voltage provided by a voltage supply terminal in the process chamber, the electrostatic chuck comprising:

(a) a dielectric covering an electrode;

(b) an electrical connector capable of connecting the electrode to the voltage supply terminal in the process chamber; and (c) means for reducing arcing and plasma discharge of gas in a gap around the electrical connector during processing of a substrate in the process chamber, the means comprising surfaces capable of moving laterally relative to one another.

23. The electrostatic chuck of claim 22 wherein the means comprises an expandable housing.

24. The electrostatic chuck of claim 22 wherein the means comprises a plurality of jackets that cooperate to define a channel around the electrical connector.

25. The electrostatic chuck of claim 24 wherein the jackets are concentric to one another.

26. The electrostatic chuck of claim 24 wherein the channel comprises a dimension that is sufficiently small to reduce arcing and plasma discharge of gas in the channel.

27. The electrostatic chuck of claim 24 wherein the channel comprises a width of less than about 1 mm, and a length of at least about 4 mm.

28. A method of electrostatically holding a substrate during processing of the substrate in a process zone, the method comprising the steps of:

(a) placing a substrate on an electrostatic chuck in the process zone, the electrostatic chuck comprising a dielectric covering an electrode;

(b) providing a voltage to the electrode of the electrostatic chuck via an electrically conducting pathway; and (c) maintaining a substantially gas sealed environment around the electrically conducting pathway during processing of the substrate in the process chamber by providing an expandable housing comprising surfaces capable of moving laterally relative to one another.

29. A method according to claim 28 wherein step (c) comprises providing the expandable housing around the electrically conducting pathway.

30. A method according to claim 29 wherein step (c) comprises pressing a plurality of sealing surfaces against one another.

31. A method according to claim 28 wherein step (c) further comprises the step of reducing arcing or plasma discharge of gas in the substantially gas sealed environment.

32. A method of electrostatically holding a substrate during processing of the substrate in a process zone, the method comprising the steps of:

(a) placing the substrate on an electrostatic chuck in the process zone, the electrostatic chuck comprising a dielectric covering an electrode;

(b) providing a voltage to the electrode of the electrostatic chuck via an electrically conducting pathway; and (c) maintaining a substantially gas sealed environment around the electrically conducting pathway during processing of the substrate in the process chamber by providing an expandable housing comprising contacting surfaces capable of sliding relative to one another.

33. A method according to claim 32 wherein step (c) comprises providing the expandable housing around the electrically conducting pathway.

34. A method according to claim 33 wherein step (c) comprises providing a channel having a dimension sized to reduce arcing or plasma discharge of gas in the channel.

35. A method according to claim 33 wherein the step of providing the expandable housing around the electrically conducting pathway comprises pressing a plurality of sealing surfaces against one another.

36. A method according to claim 32 wherein step (c) further comprises providing surfaces capable of moving laterally relative to one another.

* * * * *